United States Patent
Rudhard et al.

(10) Patent No.: US 8,791,620 B2
(45) Date of Patent: Jul. 29, 2014

(54) MICROMECHANICAL ACTUATOR HAVING MULTIPLE JOINTS

(75) Inventors: Joachim Rudhard, Leinfelden-Echterdingen (DE); Tjalf Pirk, Leonberg (DE); Marco Lammer, Stuttgart (DE); Veronique Krueger, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 1316 days.

(21) Appl. No.: 11/983,176

(22) Filed: Nov. 6, 2007

(65) Prior Publication Data

US 2008/0151342 A1 Jun. 26, 2008

(30) Foreign Application Priority Data

Nov. 7, 2006 (DE) .................. 10 2006 052 414

(51) Int. Cl.
H02N 1/00 (2006.01)
G02B 26/12 (2006.01)

(52) U.S. Cl.
USPC ........................ 310/309; 359/200.6

(58) Field of Classification Search
USPC .......................... 310/309; 318/116
See application file for complete search history.

(56) References Cited

U.S. PATENT DOCUMENTS

| | | | | |
|---|---|---|---|---|
| 5,999,303 | A * | 12/1999 | Drake | 359/224.1 |
| 6,128,122 | A * | 10/2000 | Drake et al. | 359/224.1 |
| 6,359,718 | B1 | 3/2002 | Hung-Yi et al. | |
| 6,495,893 | B2 * | 12/2002 | Lin et al. | 257/415 |
| 6,760,144 | B2 * | 7/2004 | Hill et al. | 359/290 |
| 6,822,370 | B2 * | 11/2004 | Clark et al. | 310/309 |
| 6,891,650 | B2 | 5/2005 | Mizuno et al. | |
| 6,936,950 | B2 * | 8/2005 | Akagawa et al. | 310/309 |
| 7,085,122 | B2 * | 8/2006 | Wu et al. | 361/277 |
| 7,432,629 | B2 * | 10/2008 | Mala et al. | 310/309 |
| 2002/0131679 | A1 | 9/2002 | Stevens | |
| 2004/0008400 | A1 * | 1/2004 | Hill et al. | 359/290 |
| 2005/0046504 | A1 * | 3/2005 | Xiaoyu et al. | 331/154 |
| 2008/0151342 | A1 * | 6/2008 | Rudhard et al. | 359/198 |

FOREIGN PATENT DOCUMENTS

| | | | | |
|---|---|---|---|---|
| DE | 1928598 | | 2/1999 | |
| JP | 2006238265 | * | 9/2006 | H02H 9/24 |
| WO | 03/062899 | * | 7/2003 | G02B 26/08 |

OTHER PUBLICATIONS

Machine translation of JP 2006238265, Sato, Akira and Watanabe, Toru; "vibrator structure and manufacturing method thereof", Sep. 7, 2006.*

* cited by examiner

*Primary Examiner* — John K Kim
*Assistant Examiner* — Thomas Truong
(74) *Attorney, Agent, or Firm* — Kenyon & Kenyon LLP

(57) ABSTRACT

A micromechanical actuator includes a shaft and at least a first driving mechanism. The shaft and the first driving mechanism are connected by a first joint.

4 Claims, 6 Drawing Sheets

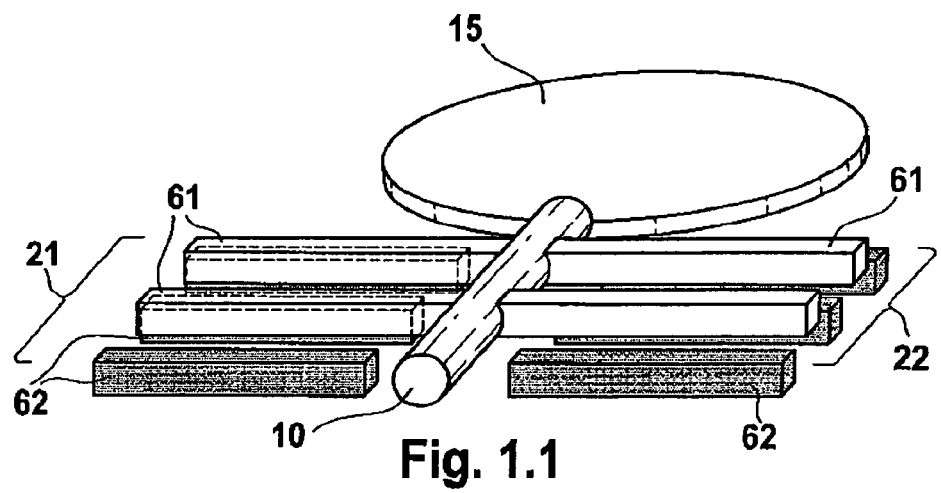
Fig. 1.1
Related Art
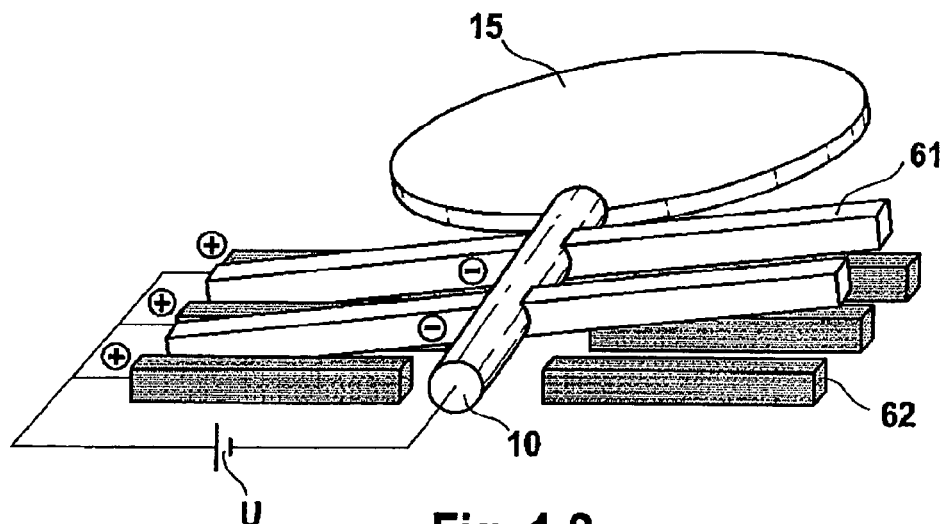
Fig. 1.2
Related Art

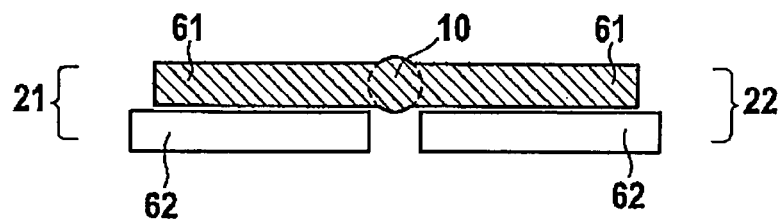
Fig. 2.1
Related Art
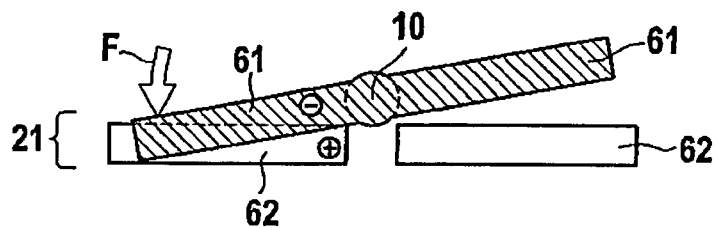
Fig. 2.2A
Related Art
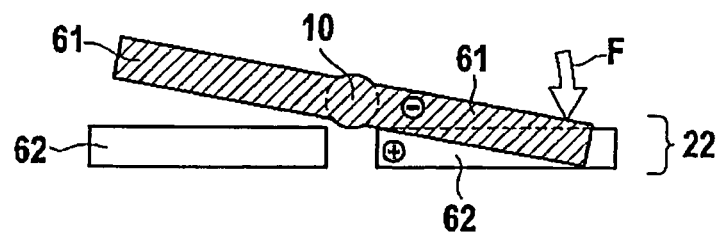
Fig. 2.2B
Related Art

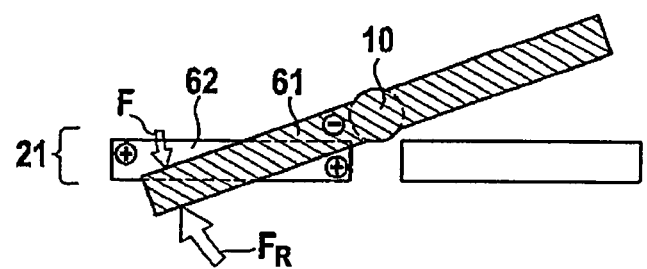
Fig. 2.3
Related Art
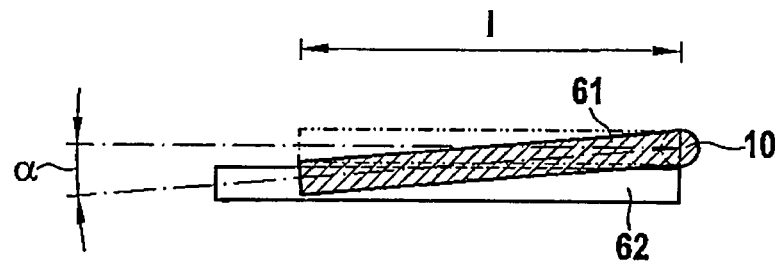
Fig. 3
Related Art

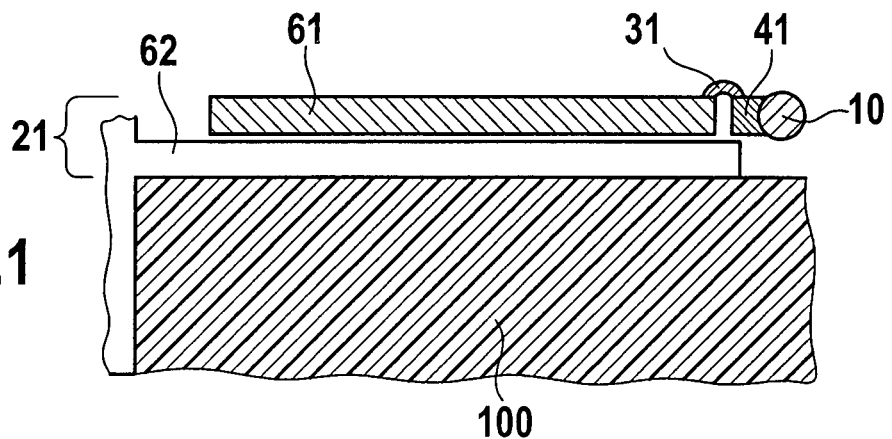
Fig. 4.1
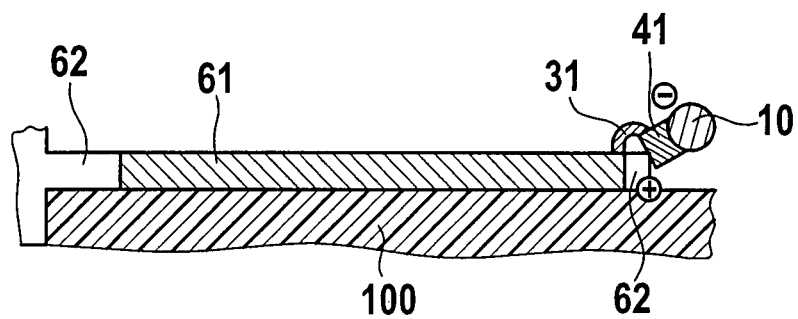
Fig. 4.2

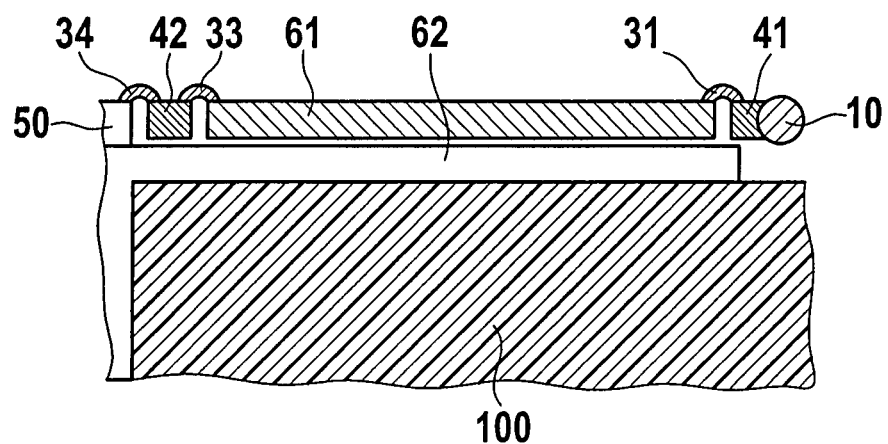
Fig. 4.3
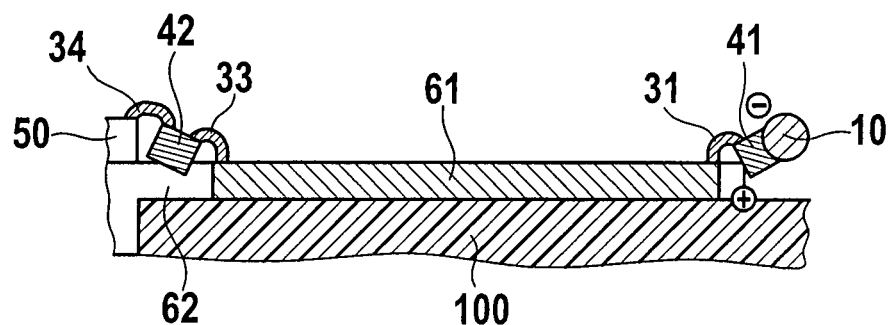
Fig. 4.4

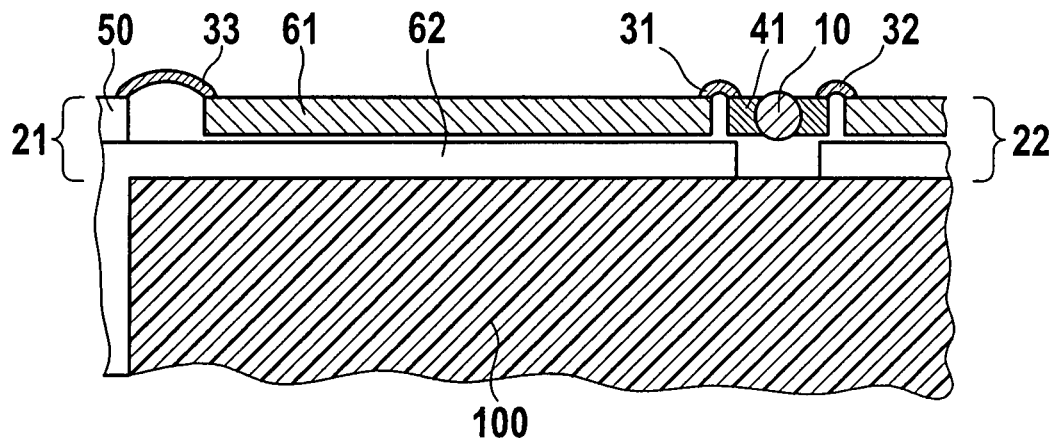
Fig. 4.5
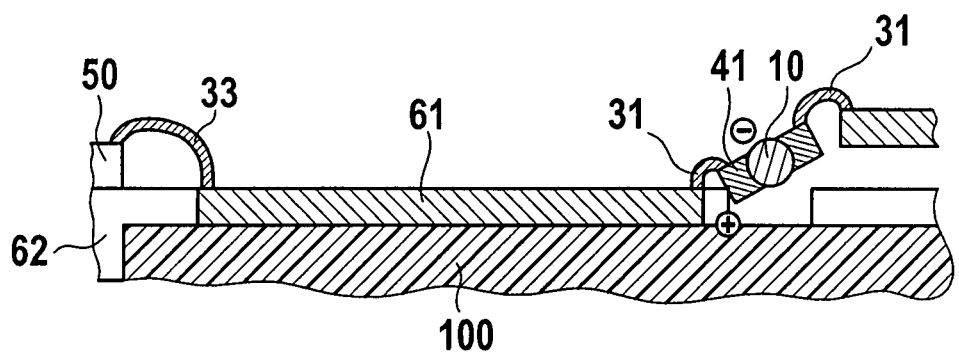
Fig. 4.6

MICROMECHANICAL ACTUATOR HAVING MULTIPLE JOINTS

FIELD OF THE INVENTION

The present invention relates to a micromechanical actuator having a shaft and having at least a first driving mechanism.

BACKGROUND INFORMATION

Electrostatic drives and capacitive detection mechanisms are known from micromechanics, especially from micromechanical sensors. Thus, for example, acceleration sensors are familiar which are evaluated capacitively via electrode combs. In addition, micromirrors are also well-known. To deflect these micromirrors, micromechanical actuators are known which have a shaft that is set into torsion by an electrostatic drive. In German Patent Application No. DE 19728598, a micromechanical actuator is described which has an electrostatic drive having junction electrodes. U.S. Pat. No. 6,891,650 describes a micromechanical actuator including an electrostatic drive having comb electrodes.

Contradictory demands are often placed on such actuators, however: On one hand, as high a force as possible should be generated in order to be able to deflect the elements in a specifically quasi-static manner; on the other hand, one would like to achieve a high angular deflection of the elements. However, a greater extension of the electrodes is advantageous for a high force, while the maximum deflection angle becomes ever smaller as the length increases.

SUMMARY OF THE INVENTION

The present invention is based on a micromechanical actuator having a shaft and having at least a first driving mechanism. An essence of the present invention is that the shaft and the first driving mechanism are connected by a first joint. In a simple case, the first driving mechanism is connected by a first joint directly to the shaft at a distance of the axis of rotation of the shaft.

However, it is advantageous that a first lever is provided, the first lever being joined at its one end to the shaft, and the first lever being joined at its other end by the first joint to the first driving mechanism. The driving mechanism is thus advantageously able to exert a torque of the desired strength on the shaft.

In one advantageous refinement of the micromechanical actuator according to the present invention, a second driving mechanism is provided, and the shaft and the second driving mechanism are connected by a second joint. It is also advantageous that the first or also the second driving mechanism is connected by a third joint to an anchorage. In one especially advantageous embodiment, a second lever is provided, the first driving mechanism or also the second driving mechanism being connected by the third joint to the one end of the second lever, and the anchorage being connected by a fourth joint to the other end of the second lever. It is also especially advantageous that at least the first driving mechanism or also the second driving mechanism is an electrostatic driving mechanism having at least one first electrode and one second electrode. It is also advantageous that one or more of the joints also permit a translatory mobility of the first or also the second driving mechanism in relation to the shaft. The actuator is advantageously disposed at the surface of a substrate, and the anchorage is joined to the substrate.

The present invention describes an electrostatic drive which is not subject to the restrictions indicated in the related art, either in the length of the electrodes or in the deflection angle of the micromechanical elements. Owing to a flexible suspension of the electrodes (both in a planar and in a comb-type implementation), the force may be established by the area independently of the angle, and the angle may be established by the length of the lever arms in respect of the axis of rotation, independently of the electrode measurement. This yields advantages like, for example, a parallel attraction of the electrode pairs and a more uniform force control due to the applied voltage. Advantageously, the dimensions of the electrodes perpendicular to the axis of rotation are also uncritical, because no restriction of the maximum deflection angle follows therefrom. Greater forces are able to be generated by the micromechanical actuator according to the present invention. Further fields of application thereby open up. Advantageously, the maximum deflection angle (rotational angle) may be sized by the geometry of the axis of rotation. The micromechanical actuator according to the present invention may also be produced more simply and cost-effectively. The connection of the driving mechanism to the shaft with the aid of a joint makes it possible, for example, to select a simplified configuration of drive electrodes, since it is not necessary to provide any space for a swing-through of the electrodes as a result of an angular deflection of the electrodes. Therefore, the actuator may advantageously be produced using surface micromechanics with less processing depth into the substrate. This makes it possible to process the substrate on one side. As a result, the process in turn is simplified, leading to cost savings and better output.

BRIEF DESCRIPTION OF THE DRAWINGS

FIG. 1.1 shows a micromechanical actuator on a micromirror in the related art, in a neutral position.

FIG. 1.2 shows a micromechanical actuator on a micromirror in the related art, in the deflected state.

FIG. 2.1 shows a cross-section through the micromechanical actuator in the related art, having comb electrodes in the neutral position.

FIGS. 2.2A, 2.2B and 2.3 each show a cross-section through the micromechanical actuator in the related art having comb electrodes deflected differently depending on the voltage applied.

FIG. 3 shows geometrical conditions on a cross-section through an electrode pair of a micromechanical actuator in the related art, in the deflected state.

FIGS. 4.1 to 4.6 show various specific embodiments of micromechanical actuators according to the present invention in a neutral position and in the deflected state.

DETAILED DESCRIPTION

FIG. 1.1 shows a micromechanical actuator on a micromirror in the related art, in the neutral position. Shown is a micromechanical actuator having a shaft 10, which is joined to first and second driving mechanisms 21 and 22. Driving mechanisms 21, 22 take the form of electrostatic driving mechanisms, each made up of a group of movable electrodes 61 and fixed electrodes 62. First and second electrodes 61 and 62 in each case form a comb-electrode structure. The first electrodes or movable electrodes 61 are secured to shaft 10. The second electrodes or fixed electrodes 62 are secured on a substrate which is located below the structure described, but is not shown here. A micromirror 15 is situated at one end of shaft 10. In response to a rotation or deflection of shaft 10 at this end about a specific angle, micromirror 15 is also rotated or deflected about this angle. Shaft 10 may be secured at its other end. The rotation of shaft 10 is then executable by torsion of shaft 10. In FIG. 1.1, the actuator is in a neutral position. Correspondingly, micromirror 15 should not be deflected.

FIG. 1.2 shows a micromechanical actuator on a micromirror in the related art, in the deflected state. Upon applying a voltage U between first and second electrodes 61 and 62 of the element and one side of the fixed electrodes, an electrostatic attractive force occurs. Electrodes 61 and 62 acted upon by voltage U come closer to each other. As a result, shaft 10 is rotated about an angle. Micromirror 15, secured to shaft 10, is deflected at the same time.

FIGS. 2.1, 2.2A, 2.2B and 2.3 show the micromechanical actuator in the related art again in cross-section. FIG. 2.1 shows a cross-section through the micromechanical actuator in the related art having comb electrodes in a first operating state, the neutral position. In this context, no electric voltage U is applied between first and second electrodes 61 and 62 of first or second driving mechanisms 21 or 22. FIGS. 2.2A, 2.2B and 2.3 each show a cross-section through the micromechanical actuator in the related art having comb electrodes that are deflected differently depending on the voltage applied. In FIG. 2.2A, an electric voltage, symbolized by the symbols + and − shown, is applied between first and second electrodes 61 and 62 of first driving mechanism 21. As a result of the effect of attractive electrostatic force F, first comb electrodes 61 are drawn between second comb electrodes 62, and shaft 10 rotates in a first direction about a rotational angle. In FIG. 2.2B, an electric voltage is applied between first and second electrodes 61 and 62 of second driving mechanism 22. As a result of the effect of attractive electrostatic force F, shaft 10 now rotates in a second direction, which is opposite the first direction, about a rotational angle. FIG. 2.3 shows what happens when shaft 10 is deflected further than up to a specific rotational angle: The electrode surface area emerging in the downward direction leads to a repelling force $F_R$ which counteracts deflecting force F, and thus limits the maximum possible deflection. In the case of planar superposed electrodes instead of the comb electrodes shown here, the deflection is limited by the geometry from the start. When movable electrode 61 strikes against fixed electrode 62, the deflection is limited mechanically. Such a mechanical limitation of the deflection also exists in the case of comb electrodes when movable electrode 61 strikes against the substrate situated under the structure.

FIG. 3 shows geometrical conditions on a cross-section through an electrode pair of a micromechanical actuator in the related art in the deflected state.

FIG. 3 reveals the dependency of the length l of the movable electrode with respect to angle $\alpha$, the rotational angle or angle of the deflection, and the thickness d as follows:

$$l = d/\tan \alpha.$$

Thus, for example, given a desired angle of $\alpha=10°$ and a thickness of the electrodes of d=20 µm, a maximum length of the electrodes of approximately l=113 µm results. The maximum attainable force F can only be increased by an elongation of the axis of rotation, or perhaps a suitable parallel connection of a plurality of electrodes or driving mechanisms, which, however, increases the needed surface area of the structure on the substrate.

FIGS. 4.1 through 4.6 show various specific embodiments of micromechanical actuators according to the present invention in the neutral position and in the deflected state.

To that end, in FIG. 4.1, a micromechanical actuator of the present invention according to a first specific embodiment is shown in the neutral position. The micromechanical actuator has a substrate 100, on which a fixed electrode 62 is disposed. A shaft 10 and a movable electrode 61 are situated above substrate 100. Movable electrode 61 and fixed electrode 62 together form a first driving mechanism 21. Movable electrode 61 as part of first driving mechanism 21 is connected to shaft 10 by a first joint 31. For example, the joint may be provided as a flexible spring. First joint 31 is joined to a first lever 41, which in turn is permanently joined to shaft 10. Alternatively, first joint 31 may also be joined directly to shaft 10 at a distance of the axis of rotation of shaft 10. Movable electrode 61 and fixed electrode 62 are in the form of comb electrodes. Joint 31 is implemented as a flexible link designed to be at least partially conductive. The at least partially conductive link ensures an electrically conductive connection between movable electrode 61 and shaft 10. A first operating state of the micromechanical actuator, the neutral position, is shown here.

In FIG. 4.2, the micromechanical actuator of the present invention according to the first specific embodiment is shown in the deflected state. The deflected state represents a second operating state of the micromechanical actuator. In this state, shaft 10 is rotated in a first direction of rotation. As a result of an applied electric voltage, as already illustrated above in the related art, first and second electrodes 61 and 62, implemented as comb electrodes, of first driving mechanism 21 are drawn into one another because of an electrostatic force. Different from the related art, however, due to joint 31 according to the present invention, it is now possible to draw or draw in movable electrode 61 to the fixed electrode not at an angle different from zero, but rather parallel to fixed electrode 62 and substrate 100.

FIGS. 4.3 and 4.4 illustrate a micromechanical actuator of the present invention according to a second specific embodiment in the neutral position and in the deflected state. Different from the first exemplary embodiment, here an anchorage 50 is provided, which is secured on substrate 100. Furthermore, a second lever 42 is provided. First driving mechanism 21 is connected by a third joint 33 to the one end of second lever 42. Anchorage 50 is connected by a fourth joint 34 to the other end of second lever 42.

FIGS. 4.5 and 4.6 show a micromechanical actuator of the present invention according to a third specific embodiment in the neutral position and in the deflected state. In contrast to the previous exemplary embodiments, first of all, a second driving mechanism 22 which is of the same kind as first driving mechanism 21 and is used for the deflection in the opposite direction of rotation is provided opposite first driving mechanism 21 at shaft 10. Second driving mechanism 22 is connected to shaft 10 by a second joint 32 in the same way as first driving mechanism 21. The representation of the area of the actuator having the second driving mechanism is only partially implemented. However, the representation with respect to first driving mechanism 21 holds true exactly the same for second driving mechanism 22. As shown for first driving mechanism 21, first and second driving mechanisms 21 and 22 are connected directly to an anchorage 50 by a third joint 33.

However, second driving mechanism 22 may also support the deflection in the first direction of rotation, in that the first and second electrodes of the second driving mechanism are acted upon by substantially identical charges.

In another operating state, first driving mechanism 21 and second driving mechanism 22 may also be acted upon equally by a voltage U in order to bring about a translatory deflection of shaft 10 in relation to substrate 100 without rotation. Translatory and rotary deflection may also be combined in a further operating state.

Further specific embodiments of the present invention, especially also other combinations of the joints according to the present invention and their arrangement, are conceivable.

The form and length of lever 41 or also 42 described may be adapted according to the desired application, just as anchorage 50 may be adapted to substrate 100. In particular, torque and rotational angle may thereby be adapted. For example, it is also conceivable to provide third joint 33 as a longer, differently implemented spring which additionally ensures the electrical insulation with respect to substrate 100 if necessary, or perhaps is secured without separate anchorage 50 directly to substrate 100. Alternatively, the present invention may also be used for planar electrodes instead of comb electrodes. In this case, fixed counter-electrode 62 is patterned on substrate 100, and by applying an electric voltage U, only the distance between the two electrodes decreases. The maximum deflection is obtained upon mechanical contact of electrodes 61 and 62. Furthermore, one or more of joints 31, 32, 33, 34 of the present invention may also be implemented elastically or flexibly in another way, such that it is variable in length and therefore permits a translatory mobility of first or also second driving mechanism 21, 22, particularly a translatory mobility of movable electrode 61, in relation to shaft 10.

What is claimed is:

1. A micromechanical actuator comprising:
   a shaft;
   at least one first driving mechanism;
   a first joint connecting the shaft and the first driving mechanism;
   a first lever, the first lever being joined at its one end to the shaft, and the first lever being joined at its other end by the first joint to the first driving mechanism;
   a second driving mechanism;
   a second joint connecting the shaft and the second driving mechanism;
   a second lever that is not a driving mechanism;
   a third joint connecting at least one of the first and second driving mechanisms to one end of the second lever;
   an anchorage; and
   a fourth joint connecting the anchorage to the other end of the second lever.

2. The micromechanical actuator according to claim 1, wherein at least one of the first and second driving mechanisms is an electrostatic driving mechanism having at least a first electrode and a second electrode.

3. The micromechanical actuator according to claim 1, wherein at least one of the first and second joints permits a translatory mobility of at least one of the first and second driving mechanisms in relation to the shaft.

4. The micromechanical actuator according to claim 1, wherein the actuator is situated at a surface of a substrate, and further comprising an anchorage joined to the substrate.

* * * * *